(12) United States Patent
Satou et al.

(10) Patent No.: US 7,327,021 B2
(45) Date of Patent: Feb. 5, 2008

(54) MULTI-LEVEL SEMICONDUCTOR MODULE

(75) Inventors: Motoaki Satou, Kyoto (JP); Takeshi Kawabata, Osaka (JP); Toshiyuki Fukuda, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/594,760

(22) Filed: Nov. 9, 2006

(65) Prior Publication Data
US 2007/0057358 A1     Mar. 15, 2007

Related U.S. Application Data

(62) Division of application No. 11/274,414, filed on Nov. 16, 2005, now abandoned.

(30) Foreign Application Priority Data

Dec. 16, 2004   (JP)   .............. 2004-364570

(51) Int. Cl.
*H01L 23/02*   (2006.01)
*H01L 21/00*   (2006.01)

(52) U.S. Cl. .............. 257/686; 257/E23.085; 438/109

(58) Field of Classification Search .............. 257/686
See application file for complete search history.

(56) References Cited

U.S. PATENT DOCUMENTS 6,285,560 B1 *   9/2001   Lyne ..................... 361/760
6,353,189 B1     3/2002   Shimada et al.
6,492,718 B2 *   12/2002  Ohmori ................. 257/686
6,717,251 B2     4/2004   Matsuo et al.
2001/0054758 A1  12/2001  Isaak
2003/0011071 A1  1/2003   Kariyazaki
2003/0042587 A1  3/2003   Lee

FOREIGN PATENT DOCUMENTS

JP   2002-064179   2/2002
JP   2003-218273   7/2003

* cited by examiner

*Primary Examiner*—Sue A. Purvis
*Assistant Examiner*—Krista Soderholm
(74) *Attorney, Agent, or Firm*—McDermott Will & Emery LLP (57) ABSTRACT

A semiconductor module is formed by alternately stacking resin boards on which semiconductor chips are mounted and sheet members having openings larger than the semiconductor chips and bonded to the resin boards. One of the resin boards located at the bottom has a thickness larger than that of each of the other resin boards. First buried conductors formed in each of first resin boards are arranged to form a plurality of lines surrounding a region on which a semiconductor chip is to be mounted. The spacing between the first buried conductors increases in succession toward the outermost line. Second buried conductors formed in each of sheet members are arranged to form a plurality of lines surrounding an opening. The spacing between the second buried conductors increases in succession toward the outermost line.

3 Claims, 7 Drawing Sheets

MULTI-LEVEL SEMICONDUCTOR MODULE

CROSS-REFERENCE TO RELATED APPLICATION

This application is a divisional of application Ser. No. 11/274,414, filed on Nov. 16, 2005, now abandoned which in turn claims priority under 35 U.S.C. § 119(a) on patent application Ser. No. 2004-364570 filed in Japan on Dec. 16, 2004, the entire contents of which are hereby incorporated by reference.

BACKGROUND OF THE INVENTION (1) Field of the Invention

The present invention relates to three-dimensional multi-level semiconductor modules formed by alternately stacking sheet members and resin boards on which semiconductor chips are mounted.

(2) Description of the Related Art

With demands for size reduction and performance improvement of various electronic devices such as cellular phones and digital cameras, multi-level semiconductor modules formed by stacking and uniting a plurality of electronic components, especially semiconductor chips, have been proposed.

Methods for easily manufacturing such multi-level semiconductor modules at low cost have been proposed to date.

A conventional semiconductor module is formed by stacking, as one unit, a printed board on which a given circuit is formed, a semiconductor chip mounted on the printed board, and an interlayer member that has an opening capable of accommodating the semiconductor chip and includes a conductive bump capable of being connected to the circuit on the printed board. Such a conventional semiconductor module is fabricated by a method including the steps of: attaching protective films to both faces of an insulating base serving as an interlayer member; forming a through hole at a given position of the insulating base; filling the through hole with a conductive paste so as to form a conductive bump; peeling off the protective films; forming, in the insulating base, an opening capable of accommodating a semiconductor chip; and alternately stacking and bonding insulating bases and printed boards (see, for example, Japanese Unexamined Patent Publication No. 2002-64179).

With this method, a through hole is formed at a given position in an insulating base having both faces to which protective films are attached, the through hole is filled with a conductive paste, and then the protective films are peeled off, thereby forming conductive bumps protruding from the faces of the insulating base. Since the through hole penetrating the insulating base is filled with the conductive paste in this method, generation of a gap in a hole during the filling is avoided and connection reliability is enhanced, as compared to the case of using a via hole whose one open side is closed. In addition, electroplating that requires time and labor is unnecessary. Accordingly, a semiconductor module is easily fabricated at low cost.

Further, with miniaturization of electronic equipment such as IC cards and cellular phones, the density of semiconductor modules needs to be further increased and the thickness thereof needs to be further reduced. For this purpose, a semiconductor module having a structure in which circuit boards on which semiconductor chips are mounted and interlayer members are alternately stacked and then are pressed with application of heat has been proposed (e.g., Japanese Unexamined Patent Publication No. 2003-218273). Specifically, circuit boards on which semiconductor chips have been mounted beforehand and interlayer members having openings capable of accommodating the semiconductor chips are alternately stacked with adhesive layers interposed therebetween, and then this stacked structure is pressed with application of heat. In this manner, the semiconductor chips are buried in the openings of the interlayer members so that electrical connection is established between the semiconductor chips through conductive posts formed on the interlayer members. With this method, the distance between the semiconductor chips is reduced, and failures caused by wiring resistance and inductance are reduced. As a result, electric signals are transmitted without delay and the density and function of the printed board are enhanced and the thickness thereof is reduced.

SUMMARY OF THE INVENTION

In recent years, techniques for reducing the thickness of semiconductor chips by polishing and techniques for mounting the thin semiconductor chips on boards with high yields have been developed, so that the number of levels of such stacked semiconductor chips has been further increasing. In addition, in a semiconductor memory, for example, as the memory capacity increases, the chip area increases. If a module is formed by stacking large semiconductor chips in multiple levels, the problem of a warp of the module arises. The degree of warp of the module increases as the thickness of a printed board decreases. Accordingly, to stack printed boards on which semiconductor chips are mounted and interlayer members in multiple levels, it is important to suppress the occurrence of a warp.

On the other hand, to reduce the size and thickness of electronic devices, semiconductor chips and semiconductor modules are often packaged by, for example, a ball grid array (BGA) method in recent years. With such a packaging method, solder balls and bump electrodes formed to establish connection to a mother board cannot be so high. Accordingly, if a warp occurs at room temperature or is caused by heating during bonding, a semiconductor module cannot be mounted on the mother board or the warp causes a partial failure in packaging. That is, a semiconductor module can be defective in packaging though it is non-defective in its electric characteristics. A module formed principally of memories, a combination of a DRAM and an SRAM and a combination of a DRAM and a flash memory, for example, needs to be embedded and controlling semiconductor devices for controlling these memories also need to be mounted. Accordingly, it is required to suppress a warp occurring when semiconductor chips having different thicknesses and characteristics are stacked.

On the other hand, in the conventional publications described above, only structures in which boards equipped with semiconductor chips having the same shape are stacked and techniques for obtaining the structures are disclosed. In the drawings of these publications, neither a structure in which two or more types of circuits are embedded nor a structure equipped with controlling semiconductor devices is disclosed. That is, in these conventional examples, though the stacked structure is disclosed, measures for suppressing a warp of a semiconductor module having a stacked structure are not disclosed.

It is an object of the present invention to provide a multi-level semiconductor module in which occurrence of a warp is suppressed.

In order to achieve this object, a first multi-level semiconductor module according to the present invention is formed by alternately stacking one or more resin boards and one or more sheet members. Each of the resin boards includes a plurality of first buried conductors and has an upper face on which a semiconductor chip is mounted. Each of the sheet members has an opening for accommodation of the semiconductor chip and includes a plurality of second buried conductors electrically connected to the first buried conductors. The first buried conductors are arranged to form a plurality of lines surrounding a mounting region on which the semiconductor chip is mounted. Some of the first buried conductors forming an outer line out of the lines are arranged with spacing greater than the spacing between some of the first buried conductors forming an inner line out of the lines.

With this structure, repulsion due to application of pressure to the resin boards in fabrication of the semiconductor module is made uniform within the planes, so that occurrence of a warp is suppressed. Accordingly, connection failures are less likely occur in the semiconductor module of the present invention when the module is connected to, for example, a mother board.

In particular, if the second buried conductors are arranged to form a plurality of lines surrounding the opening and some of the second buried conductors forming an outer line out of the lines are arranged with spacing greater than the spacing between some of the second buried conductors forming an inner line out of the lines, then an area where the first buried conductors are in contact with the second buried conductors are approximately the same among the lines. Accordingly, repulsion due to pressure application occurring in the planes of the resin boards and the sheet members is made uniform so that occurrence of a warp is suppressed. As a result, occurrence of connection failures in mounting on, for example, a mother board is suppressed, and the reliability of the semiconductor module of the present invention is enhanced, as compared to conventional semiconductor modules. In addition, variation in electrical characteristics of semiconductor devices formed in the semiconductor chips mounted on the resin boards and variation of resistance in connection between the first buried conductors and the second conductors are reduced.

Each of the sheet members preferably includes a resin core having a thickness larger than that of at least the semiconductor chip, and each of the first and second buried conductors is preferably made of a conductive resin material capable of being deformed by compression under application of pressure.

A second multi-level semiconductor module according to the present invention is formed by alternately stacking one or more resin boards and one or more sheet members. Each of the resin boards includes a plurality of first buried conductors and has an upper face on which a semiconductor chip is mounted. Each of the sheet members has an opening for accommodation of the semiconductor chip and includes a plurality of second buried conductors electrically connected to the first buried conductors. The first buried conductors are arranged to form a plurality of lines surrounding a mounting region on which the semiconductor chip is mounted. A minimum distance between adjacent two of the lines formed by the first buried conductors increases in succession from an innermost line toward an outermost line out of the lines.

With this structure, repulsion due to application of pressure to the resin boards in fabrication is made uniform within the planes, so that the degree of a warp is reduced. This structure enables reduction of variation in electrical characteristics of semiconductor devices formed in the semiconductor chips mounted on the resin boards and variation of resistance in connection between the first buried conductors and the second conductors, for example.

If the second buried conductors are arranged to form a plurality of lines surrounding the opening and a minimum distance between adjacent two of the lines formed by the second buried conductors increases in succession from an innermost line toward an outermost line out of the lines, then repulsion due to application of pressure to the resin boards and the sheet members in fabrication is made uniform within the planes, and the degree of a warp is reduced.

A third multi-level semiconductor module according to the present invention is formed by alternately stacking one or more resin boards and one or more sheet members. Each of the resin boards includes a plurality of first buried conductors and has an upper face on which a semiconductor chip is mounted. Each of the sheet members has an opening for accommodation of the semiconductor chip and includes a plurality of second buried conductors electrically connected to the first buried conductors. The first buried conductors surround a mounting region on which the semiconductor chip is mounted. The diameter of the first buried conductors increases in succession toward the mounting region. Accordingly, repulsion due to application of pressure to the resin boards in fabrication is made uniform within the planes, and the degree of a warp is reduced.

If the second buried conductors surround the opening, and the diameter of the second buried conductors increases toward the opening, then the area of the first buried conductors in contact with the second buried conductors are approximately the same within the planes of the resin boards and the sheet members. Accordingly, occurrence of a warp is allowed to be more effectively suppressed.

In particular, the first buried conductors are preferably arranged to form a plurality of lines surrounding a mounting region on which the semiconductor chip is mounted, the second buried conductors are preferably arranged to form a plurality of lines surrounding the opening, the diameter of some of the first buried conductors forming an inner line out of the lines is preferably larger than that of some of the first buried conductors forming an outer line out of the lines, and the diameter of some of the second buried conductors forming an inner line out of the lines is preferably larger than that of some of the second buried conductors forming an outer line out of the lines.

A fourth multi-level semiconductor module according to the present invention is formed by alternately stacking one or more resin boards and one or more sheet members. Each of the resin boards includes a plurality of first buried conductors and has an upper face on which a semiconductor chip is mounted. Each of the sheet members has an opening for accommodation of the semiconductor chip and includes a plurality of second buried conductors electrically connected to the first buried conductors. The first buried conductors are arranged to form a plurality of lines surrounding a mounting region on which the semiconductor chip is mounted. The diameter of some of the first buried conductors diagonally arranged in each of the resin boards is larger than or equal to that of the other first buried conductors and increases in succession the mounting region.

In this manner, only by changing the diameter of the first buried conductors diagonally arranged in each of the resin boards, occurrence of a warp is suppressed.

In this case, it is further preferable that the second buried conductors are arranged to form a plurality of lines surrounding the opening and the diameter of some of the second buried conductors diagonally arranged in each of the sheet members is larger than or equal to that of the other second buried conductors and increases in succession toward the opening.

In the first through fourth multi-level semiconductor modules, the semiconductor chip may include at least one power supply terminal and at least one ground terminal, and out of the first buried conductors diagonally arranged in each of the resin boards and the second buried conductors diagonally arranged in each of the sheet members, the first buried conductors forming an inner line out of the lines and the second buried conductors forming an inner line out of the lines may be connected to the ground terminal, and the first buried conductors forming an outer line out of the lines and the second buried conductors forming an outer line out of the lines may be connected to the power supply terminal. With this structure, even after application of heat and pressure in fabrication, power and a ground potential are supplied to semiconductor devices formed in the semiconductor chips with stability.

In the first through fourth multi-level semiconductor modules, if each of the resin boards includes: a connection terminal formed on the mounting region and connected to the semiconductor chip; and a wire connecting one of the first buried conductors to the connection terminal, then a necessary electrical inspection and a necessary burn-in test are performed after the semiconductor chips have been mounted on the resin boards, so that the module is formed after the components thereof have been determined to be non-defective.

In the first through fourth multi-level semiconductor modules, if an external connection terminal is formed on a back face of one of the resin boards located at the bottom, the multi-level semiconductor module of the present invention is allowed to be mounted to a mother board. As external connection terminals, bumps or solder balls may be used, for example. The external connection terminals may be formed only on a given region of the back face of the resin board located at the bottom or may be formed over the entire back face.

In the first through fourth multi-level semiconductor modules, a semiconductor memory may be formed in the semiconductor chip mounted on each of the resin boards except for the resin board located at the bottom, and a controlling semiconductor device for controlling the semiconductor memory may be formed in the semiconductor chip mounted on the resin board located at the bottom. With this structure, a module including control for a semiconductor memory is implemented. In addition, connection failures occurring when mounting the module on a mother board are greatly reduced.

DETAILED DESCRIPTION OF THE INVENTION

Embodiment 1

A multi-level semiconductor module according to a first embodiment of the present invention will be described with reference to FIGS. 1, 2 and 3A through 3D.

Figure 1:
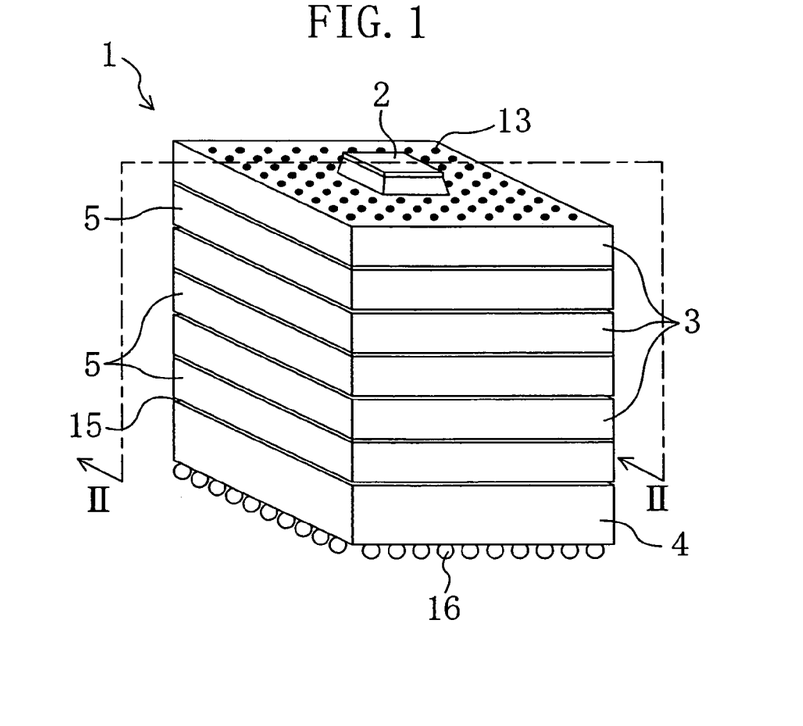
FIG. 1 is a perspective view schematically illustrating an overall structure of a semiconductor module according to each embodiment of the present invention.
Figure 2:
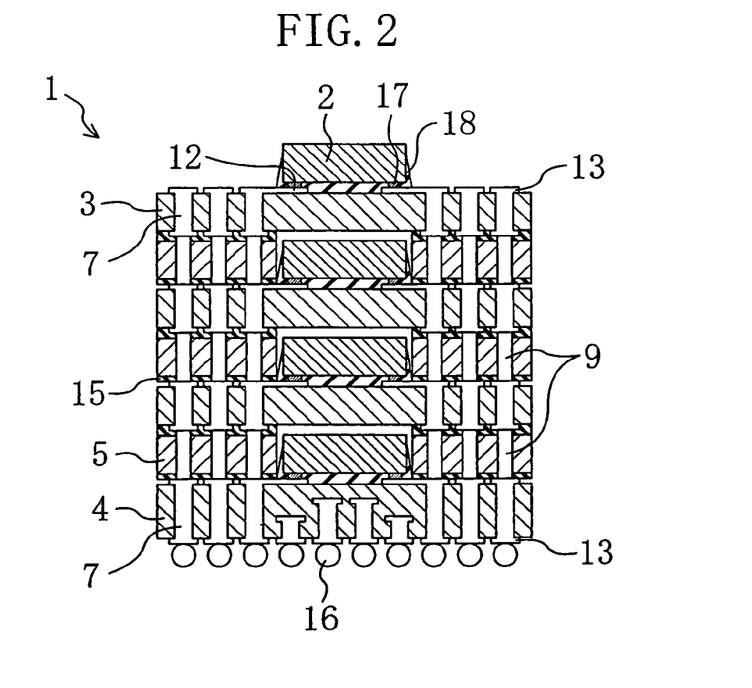
FIG. 2 is a cross-sectional view of the semiconductor module taken along the line II-II in FIG. 1.
Figure 3A:
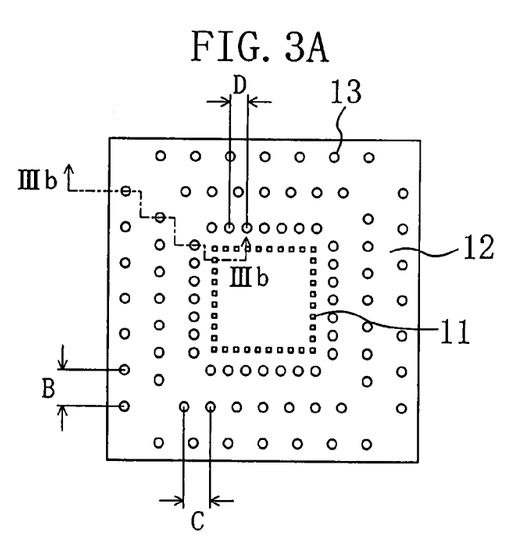
FIGS. 3A and 3C are plan views illustrating a first resin board and a sheet member, respectively, for use in a semiconductor module according to a first embodiment of the present invention.
Figure 3B:
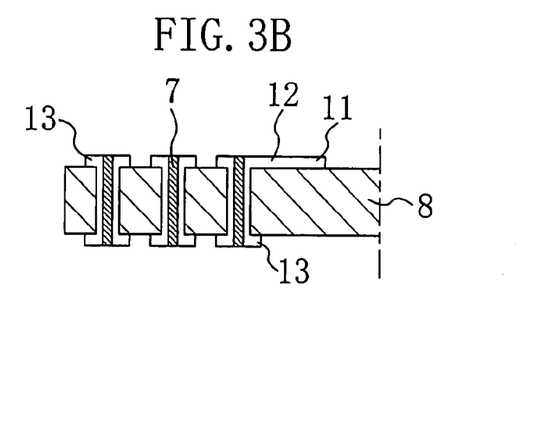
FIG. 3B is a cross-sectional view of the first resin board taken along the line IIIb-IIIb.
Figure 3C:
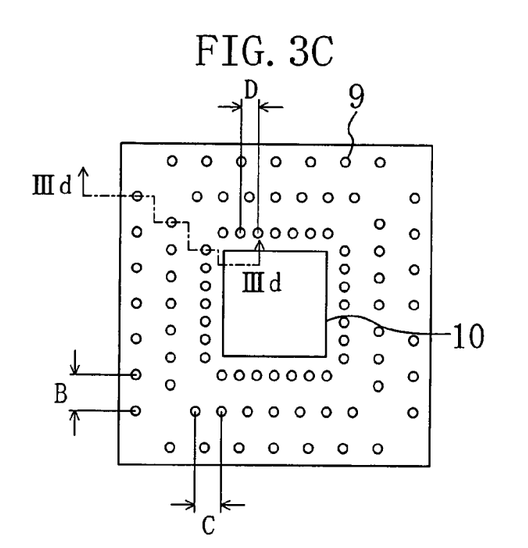
Figure 3D:
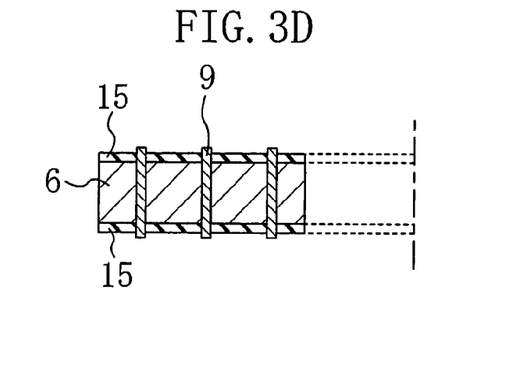
FIG. 3D is a cross-sectional view of the sheet member taken along the line IIId-IIId.

FIG. 1 is a perspective view schematically illustrating an overall structure of a semiconductor module 1 according to each embodiment of the present invention. FIG. 2 is a cross-sectional view of the semiconductor module 1 taken along the line II-II in FIG. 1. FIGS. 3A and 3C are plan views illustrating a first resin board 3 and a sheet member 5, respectively, for use in the semiconductor module 1 of this embodiment. FIG. 3B is a cross-sectional view of the first resin board 3 taken along the line IIIb-IIIb. FIG. 3D is a cross-sectional view of the sheet member 5 taken along the line IIId-IIId. In these drawings, the thicknesses, lengths and shapes of parts of the semiconductor module are selected so as to be easily shown, and therefore are different from those of actual parts. The shapes and numbers of buried conductors and external connection terminals for external connection are different from those of actual conductors and terminals and are selected to be easily shown in the drawings. The same holds in the following embodiments.

As illustrated in FIGS. 1 and 2, the semiconductor module 1 of this embodiment is formed by alternately stacking first resin boards 3 and sheet members 5. A semiconductor chip 2 is mounted on the upper face of each of the first resin boards 3. In the semiconductor module 1, the resin board at the bottom is thicker than the other resin boards and external connection terminals are provided on the back face of the bottom resin board. The semiconductor module 1 has a stacked structure made of the first resin boards 3, the second resin board 4, and the sheet members 5 that are united by applying heat and pressure. To distinguish between the bottom resin board and the other resin boards, the bottom resin board is shown as the second resin board 4 and the other boards are shown as the resin boards 3 in the drawings.

As illustrated in FIGS. 3A and 3B, each of the first resin boards 3 in the multi-level semiconductor module 1 of this embodiment includes: a first resin base (a first resin core) 8; a plurality of semiconductor-device connecting terminals 11 formed on a center region of the first resin base 8 and used for establishing connection to a semiconductor chip 2; a plurality of first buried conductors 7 formed in a peripheral portion of the first resin base 8 and penetrating the first resin base 8; a plurality of connecting lands 13 provided around both ends of the respective buried conductors 7; and a plurality of wires 12 connecting the semiconductor-device connecting terminals 11 to the connecting lands 13 and the first buried conductors 7.

As a material for the first buried conductors 7, a conductive resin material or a plated conductor is used.

The second resin board 4 provided at the bottom has a structure similar to that of the first resin boards 3 as a whole, and includes: the first resin base 8; the semiconductor-device connecting terminals 11; and the first buried conductors 7. However, the second resin board 4 is preferably thicker than each of the first resin boards 3 and has a structure in which solder balls 16 are formed on lands as external connection terminals for connection to a mother board. These solder balls 16 are formed at given intervals on the back face of the board. The semiconductor module 1 is bonded to the mother board using the solder balls 16. A feature of the semiconductor module of this embodiment is that special consideration is given to the arrangement and size of the first buried conductors 7 in the first resin boards 3 and the second resin board 4, which will be specifically described later.

The semiconductor chips 2 are connected to the semiconductor-device connecting terminals 11 of the first resin boards 3 and the bottom second resin board 4 through electrode bumps 17, and the peripheries of the semiconductor chips 2 are protected by a sealing resin 18. The sealing resin 18 protects the surfaces (i.e., the surfaces on which circuits are formed) of the semiconductor chips 2 against external environment and absorbs a thermal distortion, for example.

As illustrated in FIGS. 3C and 3D, each of the sheet members 5 includes: a second resin base (a second resin core) 6; adhesive layers 15 formed on both sides of the second resin base 6; and second buried conductors 9 provided at positions corresponding to the first buried conductors 7 of the first resin boards 3 and made of a conductive resin material. An opening 10 capable of accommodating the semiconductor chip 2 is formed in a center region of the second resin base 6. The opening 10 may penetrate the sheet member 5. The thickness of the sheet member 5 may be larger than that of the semiconductor chip 2. The opening 10 may be formed only in the back face and have a height equal to that of the semiconductor chip 2. The sheet members 5 and the first resin boards 3 may be stacked such that the semiconductor chips 2 sink in the lower faces of the soft sheet members 5 without providing the openings 10.

The second buried conductors 9 penetrate the second resin base 6, and both ends of the second buried conductors 9 project from the surfaces of the second resin base 6 to a given height. The second buried conductors 9 are semi-cured before being stacked. The second buried conductors 9 are pressed and cured by application of pressure and heat after having been stacked, and establish electrical connection to the first buried conductors 7 in the first resin boards 3 and the second resin board 4 mainly by mechanical contact.

As already described above, the semiconductor module 1 of this embodiment has a feature in which, in each board, the first buried conductors 7 are arranged to form a plurality of lines surrounding a region on which the semiconductor chip 2 is to be mounted (hereinafter, referred to a "mounting region") and the spacing between the first buried conductors 7 forming an outer line is wider than the spacing between the first buried conductors 7 forming an inner line, when viewed from the above. In addition, the second buried conductors 9 are also arranged to form a plurality of lines surrounding the opening 10 so as to establish connection to the first buried conductors 7. The spacing between the second buried conductors 9 forming an outer line is wider than the spacing between the second buried conductors 9 forming an inner line. The first buried conductors 7 and the second buried conductors 9 are symmetrical laterally and vertically in the plan views of FIGS. 3A and 3C.

In the examples illustrated in FIGS. 3A through 3D, it is defined that the spacing between the first buried conductors 7 or the second buried conductors 9 in the innermost line is D, the spacing between the first buried conductors 7 or the second buried conductors 9 in the second innermost line is C and the spacing between the first buried conductors 7 or the second buried conductors 9 in the third innermost line is B. Then, the relationship of B>C>D is established. Accordingly, the numbers of buried conductors in an inner line and an outer line are equal to each other.

To form a multi-level semiconductor module as described in this embodiment, resin boards on which semiconductor chips are mounted and sheet members including adhesive layers at both faces are alternately stacked, and then heat and pressure are applied to the top and bottom of this stacked structure so that the resin boards and the sheet members are bonded together. By this application of pressure and heat, the first buried conductors and the second buried conductors are physically brought into contact with each other. In a conventional semiconductor module, arrangements of the first buried conductors 7 and the second buried conductors 9 are not specifically taken into consideration, so that during application of pressure, nonuniform repulsion due to the pressure application can occur within the planes of the resin boards and the sheet members, resulting in creating a warp and a wave in the semiconductor module. On the other hand, in the semiconductor module of this embodiment, repulsion due to pressure application uniformly occurs within the planes of the resin boards and the sheet members, so that occurrence of a warp and a wave is suppressed.

In a case where the first resin boards 3 except for the second resin board 4 and the sheet members 5 are alternately stacked a plurality of times in the semiconductor module 1 of this embodiment, if the thicknesses of the first resin boards 3 except for the bottom second resin board 4 are made uniform and the thicknesses of the sheet members 5 are made uniform, warps of the resin boards and the sheet members are further suppressed.

The first resin bases 8 forming the first resin boards 3 and the second resin board 4 and the second resin bases 6 forming the sheet members 5 may be made of the same material such as a glass epoxy resin or an aramid resin. Alternatively, the first resin bases 8 and the second resin bases 6 may be made of different materials. For example, a glass epoxy resin, for example, may be used as the first resin bases 8 and an aramid resin, for example, may be used as the second resin bases 6. The dimensions of the first resin boards 3 and the second resin board 4 are the same as those of the sheet members 5 in plan view.

An example of the shapes of main portions of components of the multi-level semiconductor module 1 of this embodiment will be hereinafter described.

The entire shape of the semiconductor module is, for example, a rectangular solid. The thickness of each of the semiconductor chips 2 is preferably in the range from 30 μm to 150 μm, both inclusive. The thickness of each of the first resin boards 3 is in the range from 60 μm to 200 μm, both inclusive. Each of the first buried conductors 7 has a diameter ranging from 150 μm to 500 m, both inclusive. The first buried conductors 7 are arranged at a pitch ranging from 300 μm to 750 μm, both inclusive. Using these ranges, the semiconductor module is appropriately designed.

The thickness of the second resin board 4 is in the range from 100 μm to 300 μm, both inclusive, and larger than that of at least each of the first resin boards 3. The diameter and pitch of the first buried conductors 7 in the second resin board 4 are the same as those in the first resin boards 3.

The thickness of each of the second resin bases 6 as a component of the sheet members 5 is in the range from 45 μm to 200 μm, both inclusive. An adhesive layer having a thickness ranging from 10 μm to 100 μm, both inclusive, is provided on each face of the second resin bases 6. The diameter and pitch of the second buried conductors 9 in each of the sheet members 5 are the same as those in the first resin boards 3. Based on the design using the ranges described above, the multi-level semiconductor module of this embodiment is fabricated.

With the structure of the multi-level semiconductor module 1 of this embodiment, a necessary electrical inspection and a necessary burn-in test are performed on the first resin boards 3 and the second resin board 4 after mounting of the semiconductor chips 2 so that only non-defective boards are used. After the first resin boards 3, the second resin board 4 and the sheet members 5 have been stacked, the second buried conductors 9 in the sheet members 5 are compressed and cured by application of pressure and heat, so that electrical connection to the first buried conductors 7 and reduction of the resistance of the second buried conductors 9 are achieved at the same time. In addition, nonuniform loads are not placed on the semiconductor chips 2 even upon application of pressure, so that no failures occur in the semiconductor chips 2 and at the junctions between the semiconductor chips 2 and the resin boards. Furthermore, since the thickness of the semiconductor chips 2 is larger than that of the sheet members 5, no loads are placed on the semiconductor chips 2. If the second resin board 4 at the bottom is thicker than each of the other first resin boards 3, the degree of a warp of the semiconductor module is reduced.

As a result, failures are less likely to occur in mounting the stacked structure on a mother board using the solder balls 16, so that high reliability is achieved at low cost.

Embodiment 2

Figure 4A:
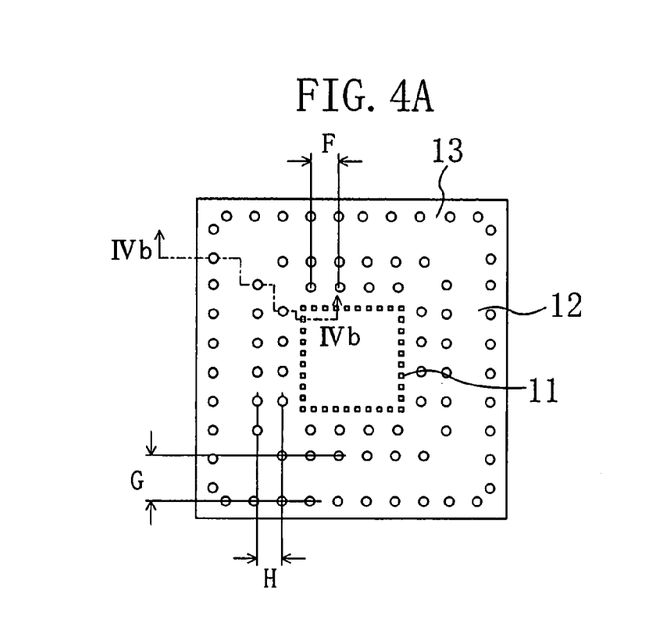
FIGS. 4A and 4C are plan views illustrating a first resin board and a sheet member, respectively, for use in a semiconductor module according to a second embodiment of the present invention.
Figure 4B:
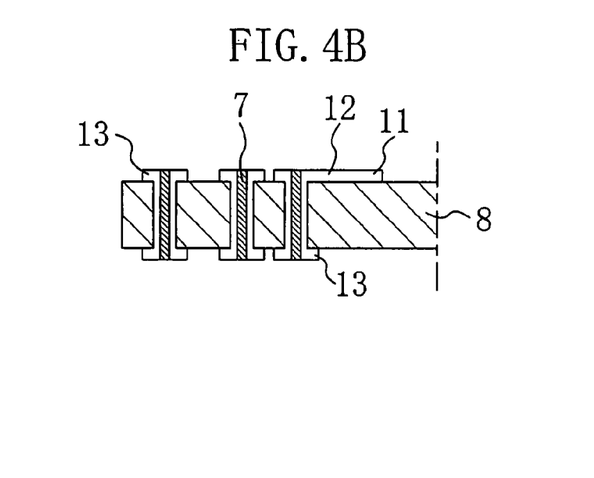
FIG. 4B is a cross-sectional view of the first resin board taken along the line IVb-IVb.
Figure 4C:
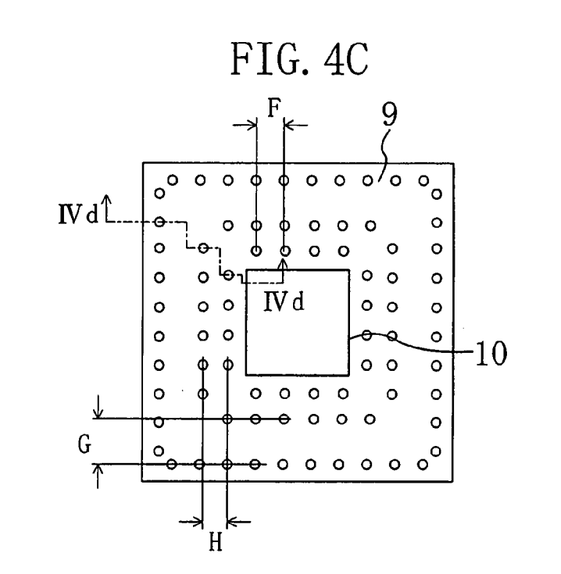
Figure 4D:
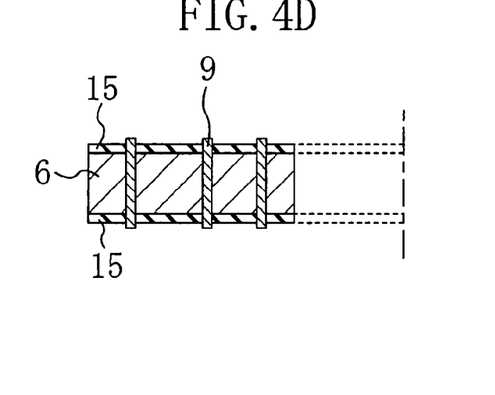
FIG. 4D is a cross-sectional view of the sheet member taken along the line IVd-IVd.

A multi-level semiconductor module according to a second embodiment of the present invention will be described with reference to FIGS. 1, 2, and 4A through 4D. FIGS. 4A and 4C are plan views illustrating a first resin board 3 and a sheet member 5, respectively; for use in a semiconductor module 1 according to this embodiment. FIG. 4B is a cross-sectional view of the first resin board 3 taken along the line IVb-IVb. FIG. 4D is a cross-sectional view of the sheet member 5 taken along the line IVd-IVd.

As illustrated in FIGS. 1 and 2, the semiconductor module of this embodiment is the same as that of the first embodiment except for the arrangement of first buried conductors 7 and-second buried conductors 9, and thus description of components already described in the first embodiment will be omitted.

As illustrated in FIG. 4A, the first buried conductors 7 are basically symmetrical laterally and vertically in plan view in first resin boards 3 and a second resin board 4 in this embodiment. The first buried conductors 7 are arranged to form a plurality of lines surrounding a region on which a semiconductor chip 2 is to be mounted in each of the boards. The spacing F between the first buried conductors 7 is uniform among the lines. The distance between a line formed by the first buried conductors 7 and its adjacent outer line formed by the first buried conductors 7 increases in succession toward the outermost line. The distance (minimum distance) between a line formed by the first buried conductors 7 and its adjacent outer line formed by the first buried conductors 7 will be hereinafter referred to as an "offset dimension". In the example illustrated in FIG. 4A, "inner offset dimension H"<"outer offset dimension G". The first buried conductors 7 have the same diameter.

In the same manner, the second buried conductors 9 are also arranged to form a plurality of lines surrounding an opening 10. The spacing between the second buried conductors 9 is the same among the lines. An outer offset dimension is larger than an inner offset dimension.

With the foregoing arrangement, the number of buried conductors forming an outer line is equal to the sum of the numbers of buried conductor forming the lines located inside the outer line. In addition, the buried conductors are arranged at separated locations, i.e., are separated into a portion near the center and a peripheral portion, in each of the sheet members 5 and the first resin boards 3, and the total area of the buried conductors arranged in the portion near the center and the total area of the buried conductors arranged in the peripheral portion are equal to each other. Accordingly, in the semiconductor module of this embodiment, repulsion caused by application of pressure occurs uniformly in the resin boards and the sheet members, so that a warp and a wave are less likely to occur even in a case where heat and pressure are applied in fabrication. As a result, excellent connection to a mother board is established in the semiconductor module of this embodiment. In particular, with the arrangement of this embodiment, the number of buried conductors forming a plurality of inner lines is larger than that in the arrangement of the first embodiment, so that a sufficiently high pressure is applied to the inside of the module in bonding the semiconductor module under pressure.

In the semiconductor module of this embodiment, the first buried conductors 7 or the second buried conductors 9 are arranged to form three surrounding lines. Alternatively, the first buried conductors 7 and the second buried conductors 9 may be arranged to form four or more lines. In such a case, lines located at the inner side of the midpoint between the outermost line and the innermost line are used as inner lines, lines at the outer side of the midpoint are used as outer lines, and the number of buried conductors forming the outer lines is approximately equal to the number of buried conductors forming the inner lines.

Embodiment 3

Figure 5A:
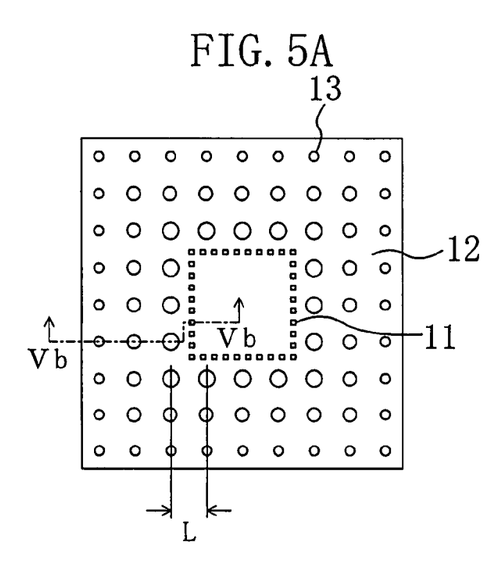
FIGS. 5A and 5C are plan views illustrating a first resin board and a sheet member, respectively, for use in a semiconductor module according to a third embodiment of the present invention.
Figure 5B:
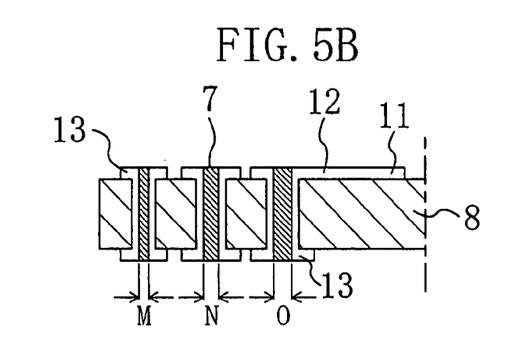
FIG. 5B is a cross-sectional view of the first resin board taken along the line Vb-Vb.
Figure 5C:
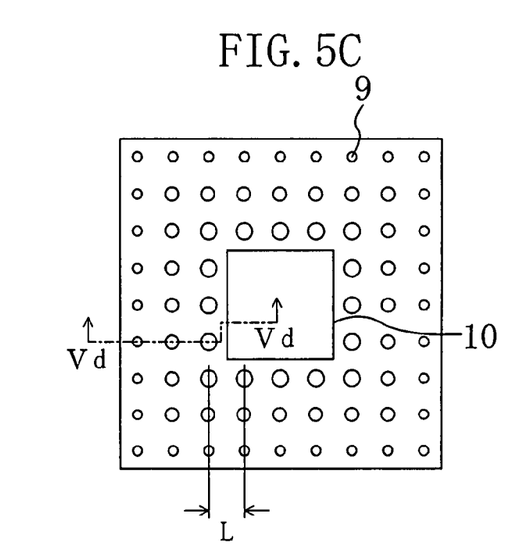
Figure 5D:
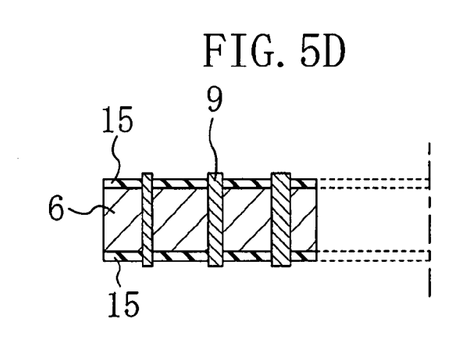
FIG. 5D is a cross-sectional view of the sheet member taken along the line Vd-Vd.

A multi-level semiconductor module according to a third embodiment of the present invention will be described with reference to FIGS. 1, 2, and 5A through 5D. FIGS. 5A and 5C are plan views illustrating a first resin board 3 and a sheet member 5, respectively, for use in a semiconductor module 1 according to this embodiment. FIG. 5B is a cross-sectional view of the first resin board 3 taken along the line Vb-Vb. FIG. 5D is a cross-sectional view of the sheet member 5 taken along the line Vd-Vd.

As illustrated in FIGS. 1 and 2, the semiconductor module of this embodiment is the same as that of the first embodiment except for the arrangements and diameters of first buried conductors 7 and second buried conductors 9, and thus description of the same components will be omitted.

As illustrated in FIG. 5A, the first buried conductors 7 are basically symmetrical laterally and vertically in plan view in first resin boards 3 and a second resin board 4 of this embodiment. The first buried conductors 7 are arranged to form a plurality of lines surrounding a region on which a semiconductor chip 2 is to be mounted in each of the boards. The spacing L between the first buried conductors 7 is uniform among the lines. The diameter of the first buried conductors 7 increases in succession toward the innermost line. In the example illustrated in FIGS. 5A and 5B, with respect to the diameter, the relationship of O>N>M is established.

As illustrated in FIG. 5C, the second buried conductors 9 are also arranged to form a plurality of lines surrounding an opening 10. The spacing L between the second buried conductors 9 is the same among the lines. The diameter of the second buried conductors 9 increases in succession toward the innermost line.

With the foregoing configuration, in the semiconductor module of this embodiment, the total area of buried conductors forming an inner line and the total area of buried conductors forming an outer line are approximately equal to each other in plan view. Accordingly, in the semiconductor module of this embodiment, repulsion caused by application of pressure during application of heat and pressure occurs uniformly in the resin boards and the sheet members, so that a warp and a wave are less likely to occur even when heat and pressure are applied in fabrication. As a result, in the semiconductor module of this embodiment, connection failures are less likely to occur in connection to a mother board through, for example, solder balls 16, and the reliability is greatly enhanced.

The first buried conductors 7 do not necessarily form lines in the first resin boards 3 and the second resin board 4 of the semiconductor module of this embodiment. It is sufficient that the diameter of the first buried conductors 7 surrounding the mounting region increases in succession toward the center of the resin board. The total area of buried conductors forming an outer line is preferably equal to the total area of buried conductors forming an inner line. This is because a warp is further effectively suppressed in this case. The same holds for the second buried conductors 9.

Embodiment 4

Figure 6A:
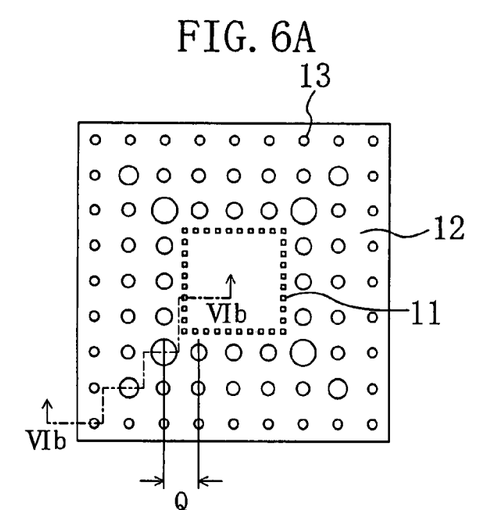
FIGS. 6A and 6C are plan views illustrating a first resin board and a sheet member, respectively, for use in semiconductor modules according to fourth and fifth embodiments of the present invention.
Figure 6B:
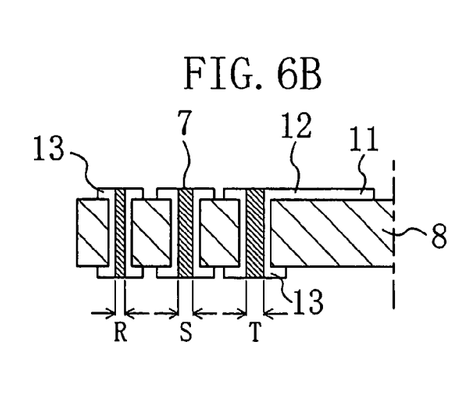
FIG. 6B is a cross-sectional view of the first resin board taken along the line VIb-VIb.
Figure 6C:
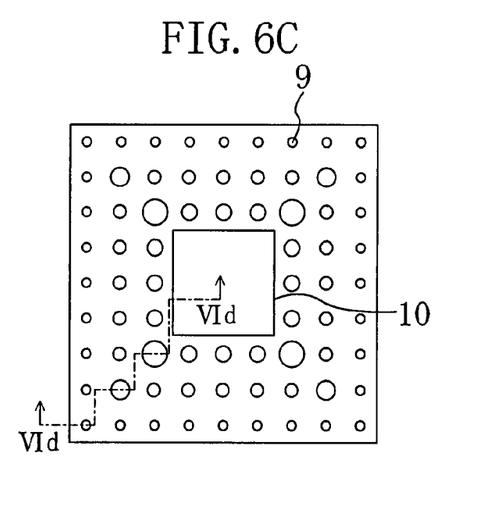
Figure 6D:
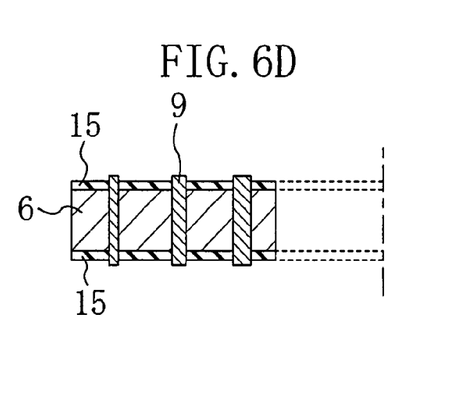
FIG. 6D is a cross-sectional view of the sheet member taken along the line VId-VId.
Figure 6E:
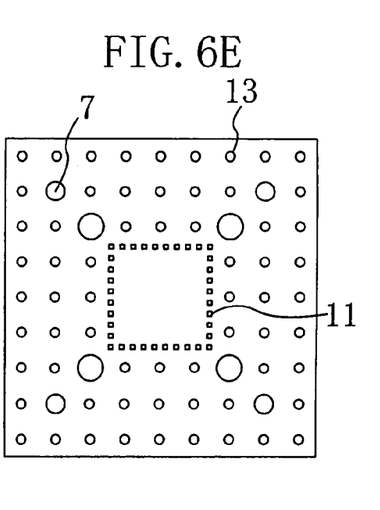
FIG. 6E is a plan view illustrating a modified example of the first resin board.

A multi-level semiconductor module according to a fourth embodiment of the present invention will be described with reference to FIGS. 1, 2 and 6A through 6D. FIGS. 6A and 6C are plan views illustrating a first resin board 3 and a sheet member 5, respectively, for use in a semiconductor module 1 according to this embodiment. FIG. 6B is a cross-sectional view of the first resin board 3 taken along the line VIb-VIb. FIG. 6D is a cross-sectional view of the sheet member 5 taken along the line VId-VId. FIG. 6E is a plan view illustrating a modified example of the first resin board 3.

As illustrated in FIGS. 1 and 2, the semiconductor module of this embodiment is the same as that of the first embodiment except for the arrangements and diameters of first buried conductors 7 and second buried conductors 9, and thus description of components already described in the first embodiment will be omitted.

As illustrated in FIG. 6A, the first buried conductors 7 are basically symmetrical laterally and vertically in plan view in first resin boards 3 and a second resin board 4 of this embodiment. The first buried conductors 7 are arranged to form a plurality of lines surrounding a region on which a semiconductor chip 2 is to be mounted in each of the boards. The spacing Q between the first buried conductors 7 is the same among the lines. The diameter of the first buried conductors 7 diagonally arranged in a resin board increases in succession toward the innermost line. As illustrated in FIG. 6E, the diameter of the other first buried conductors 7 may be the same as that of the first buried conductors 7 located at the corners of the outermost line. In the example illustrated in FIGS. 6A and 6B, with respect to the diameter, the relationship of T>S>R is established.

As illustrated in FIG. 6C, the second buried conductors 9 are also arranged to form a plurality of lines surrounding an opening 10. The spacing Q between the second buried conductors 9 is the same among the lines. The diameter of the second buried conductors 9 diagonally arranged in each of the sheet members 5 increases in succession toward the innermost line. The diameter of the other second buried conductors 9 may be the same as that of the second buried conductors 9 located at the corners of the outermost line.

In a case where the first resin boards 3, the second resin board 4 and the sheet members 5 have shapes other than quadrilaterals, the diameters of buried conductors in a portion of a line are increased so as to be symmetrical laterally and vertically in plan view.

With the foregoing configuration, the total area of buried conductors forming an inner line and the total area of buried conductors forming each outer line are equal to each other in plan view. Accordingly, in the semiconductor module of this embodiment, repulsion caused by application of pressure occurs uniformly in the resin boards and the sheet members during application of heat and pressure. As a result, in the semiconductor module of this embodiment, connection failures are less likely to occur in connection to a mother board through, for example, solder balls 16, and the reliability is greatly enhanced.

Embodiment 5

A multi-level semiconductor module according to a fifth embodiment of the present invention will be described with reference to FIGS. 1, 2 and 6A through 6D. A semiconductor module 1 according to this embodiment has the same configuration as that of the fourth embodiment but is different only in components to which buried conductors diagonally arranged in each of resin boards and sheet members are connected.

Specifically, in a case where the diameters of first buried conductors 7 forming three surrounding lines have the relationship of T>S>R as illustrated in FIGS. 6A and 6B, the first buried conductors 7 forming an outer line having a diameter R are connected to power supply terminals of a semiconductor chip 2 and the first buried conductors 7 forming inner lines having diameters T and S are connected to ground terminals (GND terminals) of the semiconductor chip 2.

With this configuration, repulsion caused by application of pressure occurs uniformly in the resin boards and the sheet members during application of heat and pressure, so that electric power and a ground voltage are supplied with stability even with the occurrence of repulsion due to pressure application. As a result, the reliability of the semiconductor module is enhanced, as compared to a conventional semiconductor module.

Embodiment 6

Figure 7A:
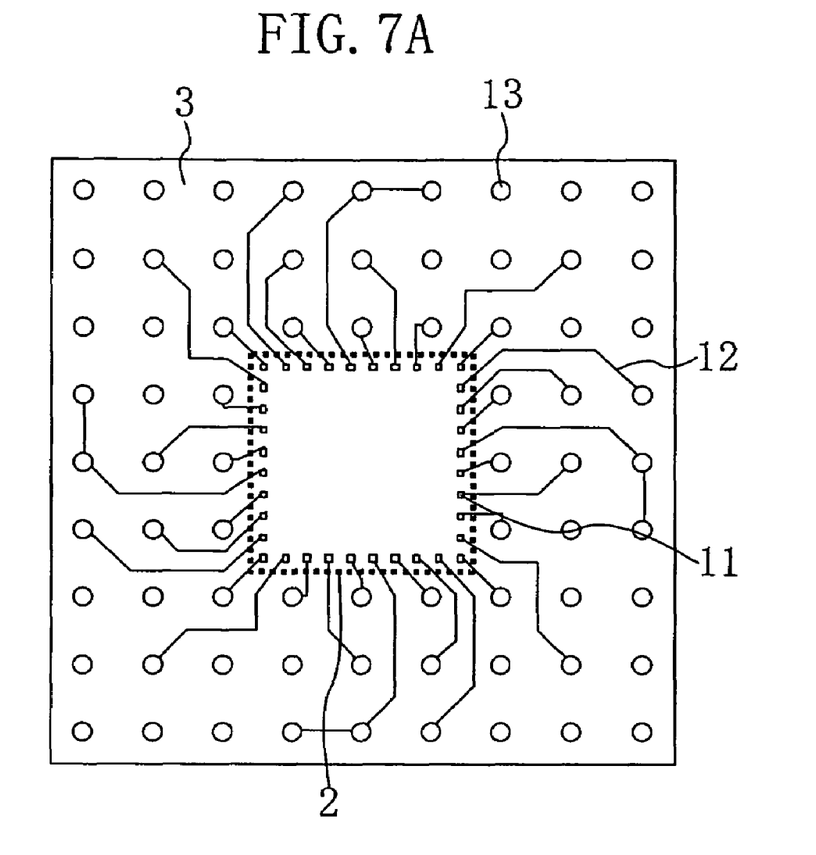
FIGS. 7A and 7B are a plan view and a cross-sectional view, respectively, illustrating a first resin board on which a semiconductor chip is mounted in a semiconductor module according to a sixth embodiment of the present invention.
Figure 7B:
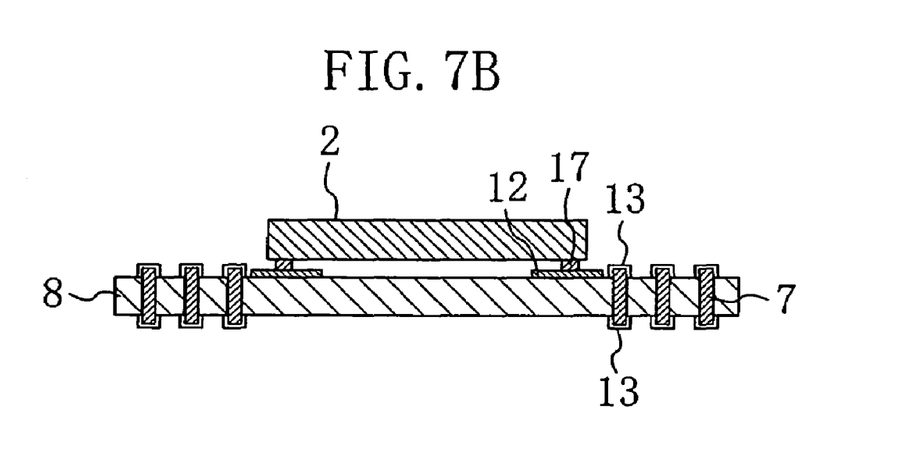

A multi-level semiconductor module according to a sixth embodiment of the present invention will be described with reference to FIGS. 7A and 7B. FIGS. 7A and 7B are a plan view and a cross-sectional view, respectively, illustrating a first resin board on which a semiconductor chip is mounted in the semiconductor module of this embodiment.

As illustrated in FIGS. 7A and 7B, a mounting region on which a semiconductor chip 2 is to be mounted is formed in each of first resin boards 3 and a second resin board 4 for the semiconductor module of this embodiment. Each of the first resin boards 3 and the second resin board 4 includes: first buried conductors 7 provided in a region other than the mounting region; semiconductor-device connecting terminals 11 provided in the mounting region; and wires 12 connecting the first buried conductors 7 to the semiconductor-device connecting terminals 11. In this manner, a region on which the first buried conductors 7 are formed is separated from a region on which the semiconductor chip 2 is mounted, so that the semiconductor-device connecting terminals 11 necessary for the multi-level structure of the module are allowed to be separately connected to the first buried conductors forming an outer line and the first buried conductors forming an inner line in a resin board. This configuration enables board design for suppressing variation in repulsion due to application of pressure under application of heat and pressure.

Embodiment 7

Figure 8:
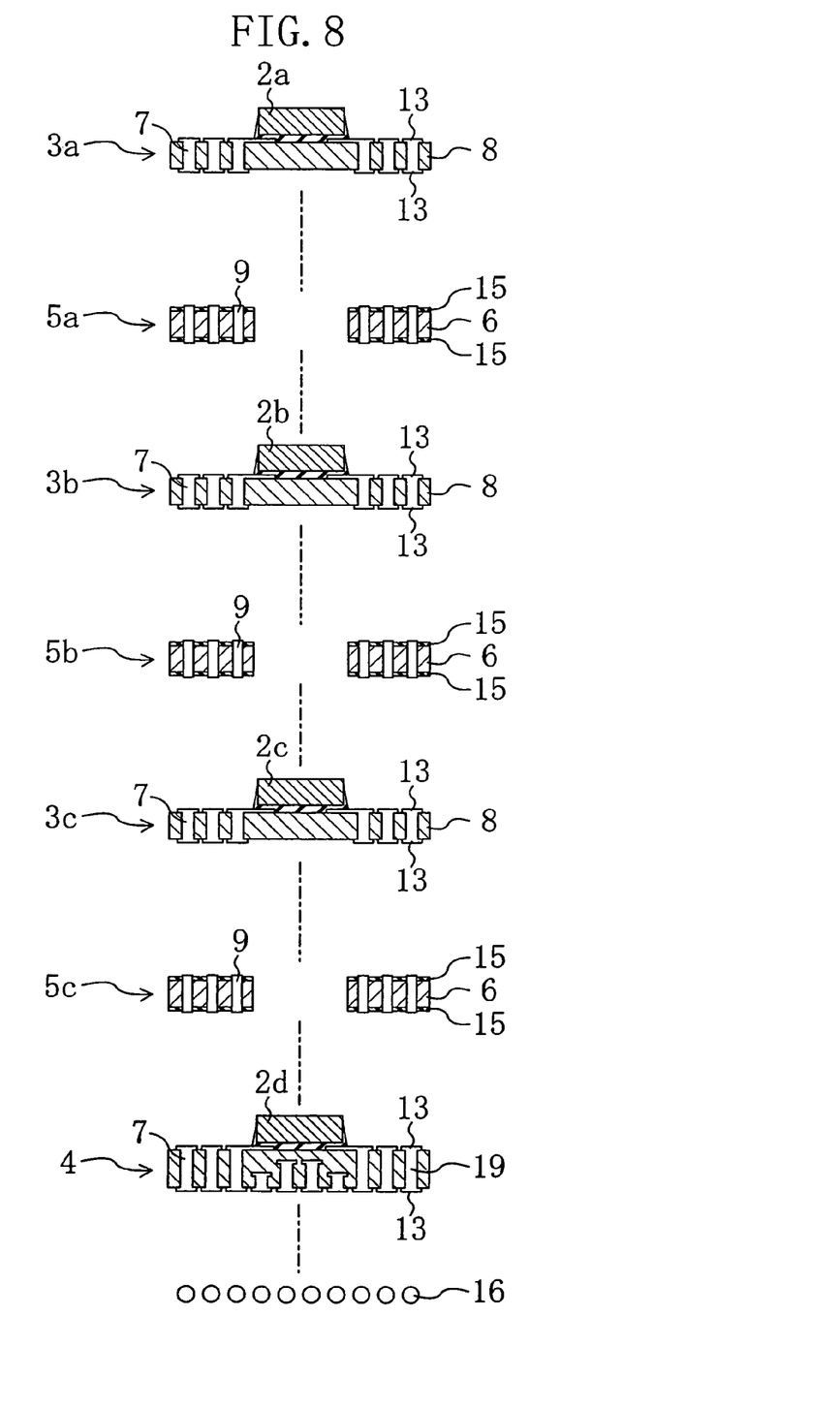
FIG. 8 is a cross-sectional view illustrating a semiconductor module according to seventh and eighth embodiments of the present invention in a disassembled state.

FIG. 8 is a cross-sectional view illustrating a semiconductor module of each of the foregoing embodiments in a disassembled state. In FIG. 8, the structures of the semiconductor modules of the first through sixth embodiments are shown in a plain manner. It should be noted that in the semiconductor modules of the first through sixth embodiments, the semiconductor chips 2a, 2b, 2c and 2d are the same.

In the semiconductor module illustrated in FIG. 8, a plurality of connecting lands 13 and solder balls 16 for connection to external equipment are formed on the surface of the bottom second resin board 4 opposite to the surface thereof on which the semiconductor chip 2d for control is mounted. This achieves both a multi-level structure and installation to the external equipment.

With this configuration, the semiconductor module of each of the embodiments of the present invention is allowed to be mounted on a mother board using external connection terminals such as the solder balls 16.

Embodiment 8

A multi-level semiconductor module according to an eighth embodiment of the present invention will be described with reference to FIG. 8.

In the semiconductor module of this embodiment, semiconductor chips 2a, 2b and 2c including semiconductor memories are mounted on first resin boards 3a, 3b and 3c, respectively. A semiconductor chip 2d on which a control semiconductor device for controlling a semiconductor memory is formed is mounted on a second resin board 4.

With this structure, a maximum number of signal terminals connected to an external board such as a product are provided, and a signaling system of memories which do not need inspection is easily closed within a module. Accordingly, high-density packaging is enabled.

As described above, in a multi-level semiconductor module according to the present invention, the occurrence of a warp is suppressed during fabrication. In addition, the module is coupled to a mother board with high yield. Accordingly, the multi-level semiconductor module is useful for reduction in size and enhancement of function of various electronic devices such as cellular phones and digital cameras.

What is claimed is:

1. A multi-level semiconductor module formed by alternately stacking one or more resin boards and one or more sheet members, each of the resin boards including a plurality of first buried conductors and having an upper face on which a semiconductor chip is mounted, each of the sheet members having an opening for accommodation of the semiconductor chip and including a plurality of second buried conductors electrically connected to the first buried conductors, wherein the first buried conductors surround a mounting region on which the semiconductor chip is mounted, and the diameter of the first buried conductors increases in succession toward the mounting region.

2. The multi-level semiconductor module of claim 1, wherein the second buried conductors surround the opening, and the diameter of the second buried conductors increases toward the opening.

3. The multi-level semiconductor module of claim 2, wherein the first buried conductors are arranged to form a plurality of lines surrounding a mounting region on which the semiconductor chip is mounted, the second buried conductors are arranged to form a plurality of lines surrounding the opening, the diameter of some of the first buried conductors forming an inner line out of the lines is larger than that of some of the first buried conductors forming an outer line out of the lines, and the diameter of some of the second buried conductors forming an inner line out of the lines is larger than that of some of the second buried conductors forming an outer line out of the lines.

* * * * *